(12) United States Patent
Riordan et al.

(10) Patent No.: US 6,240,100 B1
(45) Date of Patent: May 29, 2001

(54) CELLULAR TDMA BASE STATION RECEIVER WITH DYNAMIC DC OFFSET CORRECTION

(75) Inventors: Kenneth B. Riordan, Spring Grove; Neil Peplinski, Schaumburg; David J. Anderson, Elgin, all of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/904,398

(22) Filed: Jul. 31, 1997

(51) Int. Cl.[7] ................................................. H04B 7/212
(52) U.S. Cl. ............................................. 370/442; 370/347
(58) Field of Search .................................. 370/321, 337, 370/347, 348, 442; 455/324, 214, 234.2; 375/319

(56) References Cited

U.S. PATENT DOCUMENTS

| | | | |
|---|---|---|---|
| 5,204,977 | * | 4/1993 | Feldt ................................. 455/234.2 |
| 5,212,826 | * | 5/1993 | Rabe et al. ............................ 455/214 |
| 5,422,889 | * | 6/1995 | Sevenhans et al. ................... 370/442 |

\* cited by examiner

Primary Examiner—Huy D. Vu
Assistant Examiner—Alexander Boakye
(74) Attorney, Agent, or Firm—Kenneth A. Haas; Richard A. Sonnentag

(57) ABSTRACT

A receiver (10) corrects for dynamic DC offsets by utilizing an open loop predictive DC offset correction stage (18) to respond instantly to changes in AGC settings on a timeslot by timeslot basis. The receiver has an AC coupled baseband receiver and has memory (22) for storing calibration offset data (24 and 26) representing a calibration offset voltage value for each automatic gain control (AGC) state determined relative to a known reference value. The predictive DC offset stage (18) predicts a predictive DC offset correction value (74 and 76) for a selected timeslot using stored calibration offset data (24 and 26) and an average of stored calibration offset data corresponding to AGC states for all timeslots in a given frame.

10 Claims, 7 Drawing Sheets

FIG.1
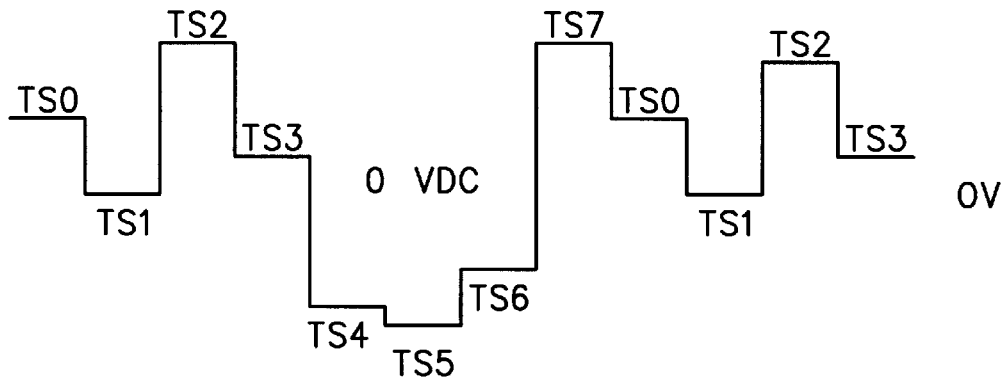
FIG.4.2
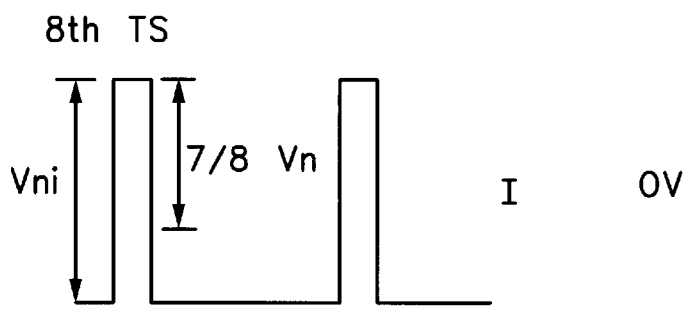
FIG.4.3
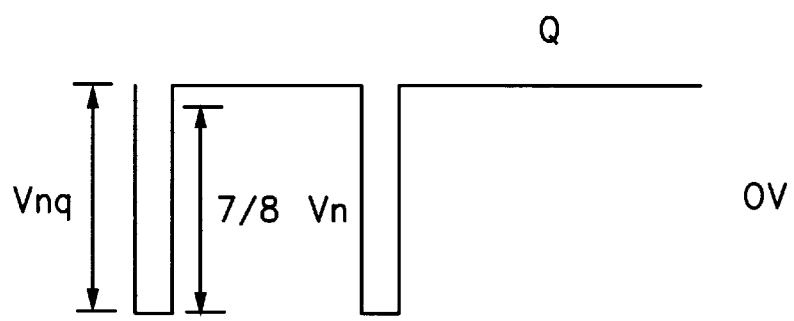

FIG.4.1

CLOSED LOOP DYNAMIC
DC OFFSET CORRECTION

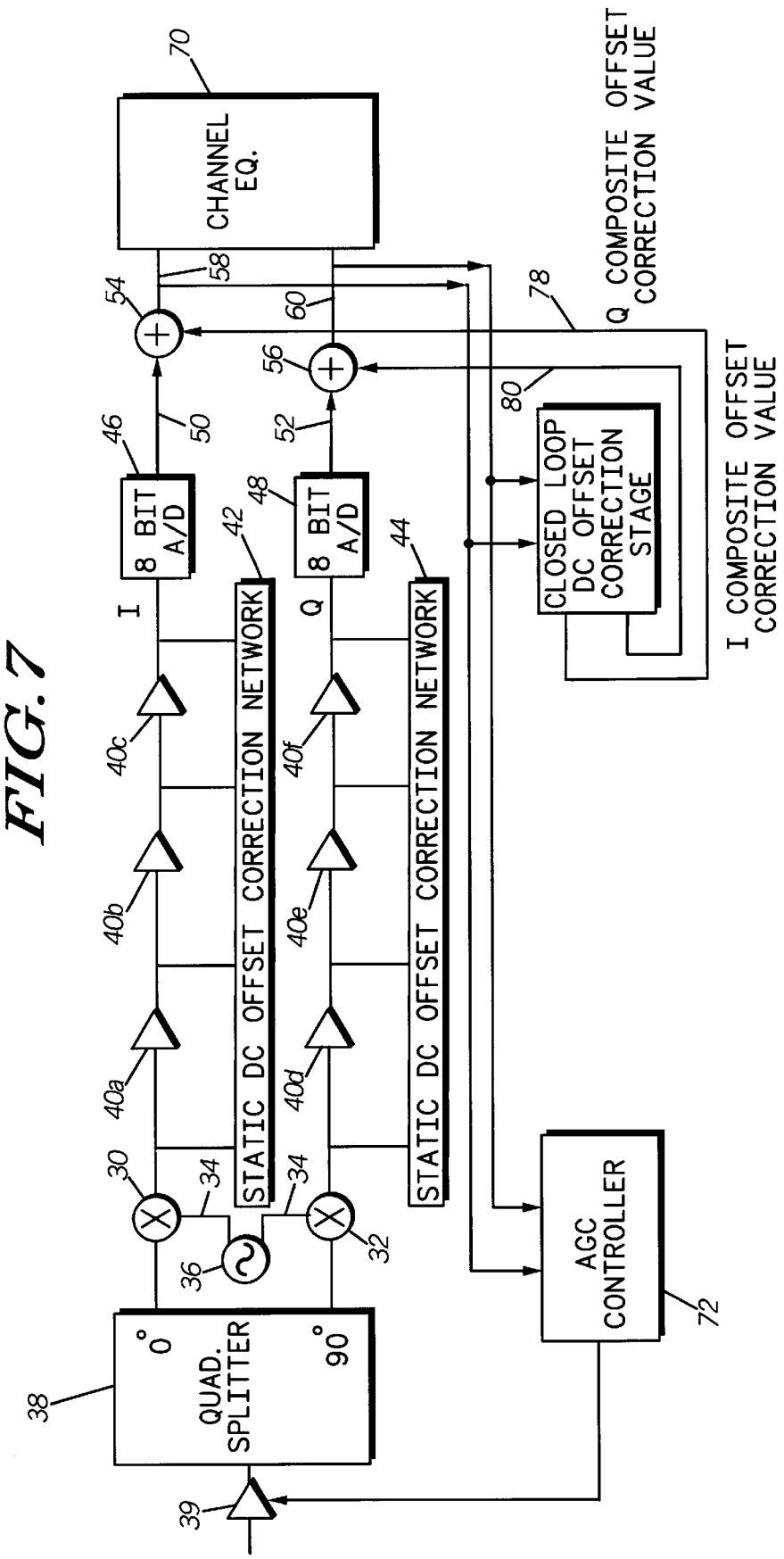

CELLULAR TDMA BASE STATION RECEIVER WITH DYNAMIC DC OFFSET CORRECTION

FIELD OF THE INVENTION

The invention relates generally to time division multiple access (TDMA) base station receivers and more particularly to TDMA base station zero-intermediate frequency (IF) receivers.

BACKGROUND OF THE INVENTION

In radio frequency zero-IF receivers, DC voltage offsets can seriously degrade the bit error rate (BER) performance of received information. In the context of zero-IF receivers, DC offsets refer to undesired DC voltages that appear in the in-phase (I) and quadrature phase (Q) baseband stages of the receiver, and consequently degrade the performance of the receiver. Two types of DC offsets occur in zero IF receivers. The static type of DC offset may occur in any zero IF receiver, and dynamic DC offsets are unique to zero IF receivers used in TDMA systems. With the trend toward reducing the size of base station receiver circuitry and components through integrated circuitry (IC) design, controlling the static and dynamic DC offsets through conventional methods becomes increasingly difficult.

Static offsets can result from offset voltages inherent to baseband amplifiers and can also result from local oscillator (LO) leakage into the mixers of the IF stages of the receiver. LO leakage can be the result of conducted and/or radiated energy from the local oscillator. For example, LO signals can radiate into IF amplifier traces, couple into the IF stage via power supply circuitry or conduct back through the mixer itself. Therefore, the local oscillator frequency may appear on the input of the IF/LO mixer resulting in the offsets. The static DC offsets are typically corrected by adding AC coupling capacitors to the baseband amplifier stages. The AC coupling capacitors are typically discrete components. Alternatively, offset compensation loops, as known in the art, are placed throughout the devices. In both cases, the effect is to add a high pass filter response to the baseband filter function. In some TDMA cellular systems, such as the GSM systems, the baseband information spectrum can extend down to zero Hz. Consequently, any high pass filtering will result in lost information in such systems. However, by keeping the high pass corner frequency below about 40 Hz, BER degradation can be kept below an acceptable level.

The dynamic type of DC offsets are more critical in zero IF baseband receivers. Dynamic offsets result from the same LO leakage described with respect to the static DC offsets. However, in the case of TDMA receivers, the LO leakage signal which appears at the RF port of the mixer can vary from timeslot to timeslot, producing a DC offset waveform at the output of the receiver as shown in FIG. 1. As shown, the desired I or Q channel information waveform rides on top of the dynamic DC offset waveform. Consequently, from the perspective of any individual timeslot (TS0–TS7), there is a non zero DC offset above or below the 0 VDC reference voltage. Although AC coupled, the receiver typically has no way to reject this waveform. For example, a GSM type cellular TDMA system has a timeslot duration of approximately 600 microseconds. The generated dynamic DC offset waveform may have an effective frequency of less than 1 KHz. This waveform easily passes through the typical 90 KHz low pass filter response of the GSM baseband stages.

The magnitude and phase of the LO vestige signals present at an RF port of the mixer is a function of gains and reflection coefficients throughout the IF portion of the receiver. In TDMA systems, the very same gains and reflection coefficients can change dramatically as a receiver reconfigures its gain (AGC) setting between timeslots. The problem is compounded by the fact that the gain settings for a given timeslot are also time variant as the mobile transmitting units move closer and further from the base station and as call traffic comes and goes. Therefore, the dynamic DC offset wave not only changes from timeslot to timeslot, but also from frame to frame. The presence of dynamic DC offset voltages as visible to a detector stage of a receiver has been shown to degrade BER performance. For example, it has been found, that a zero IF TDMA base station receiver should have a combined I channel DC offset and Q channel DC offset of less than 3% of the full scale input of an A/D converter that converts the analog signal to digital signal for the detector. With the combined DC offsets of the I and Q channel less than 3%, the DC offset can produce less than 0.5 dB degradation of BER performance, hence, it would be desirable to remove or substantially reduce the undesirable dynamic DC offset prior to channel equalization to reduce BER.

Conventional DC offset correction methods generally include placing the LO signal trace on one side of a circuit board and placing the IF signal trace on another side of the PC board to help reduce the radiation impact of the signals. In addition, metal shielding is typically placed around the LO to further help isolate the LO radiation from interfering with other receiver circuitry. Such methods can not typically be applied to integrated circuits due to the small size and location of the signal traces on the IC and other factors, particularly when the quadrature down converter and baseband circuitry is on one integrated circuit.

Another method of reducing DC offsets is to lower the IF frequency prior to the baseband stage through a triple conversion receiver where three IF stages (including the baseband stage) are used and the IF stage prior to the baseband stage has a lower LO frequency because it has been scaled down. In this way, the LO signal may be at a lower frequency thereby being less prone to radiation, which in turn causes less offset. However, the use of triple conversion filters requires additional components on an integrated circuit and adds complexity resulting in higher costs.

Also, another type of offset correction circuit, disclosed in U.S. Pat. No. 5,442,655 to Dedic et al., issued Aug. 15, 1995 tends to first eliminate all DC offset components both natural offsets and undesired offsets. Natural DC offset refers to the inherent, non-zero, DC value of the burst or timeslot. It has been found that with random modulation, there is greater than 40% probability that the natural DC offset (of I or Q) will exceed 1.5% of full scale. To remove the natural offset would have the same degradation affects as adding an erroneous offset of equal amplitude. The Dedic et al. circuit then attempts to estimate the natural offset from received data and add the natural offset back in to the data. By estimating the natural offset, error can be unnecessarily introduced. A viable DC offset solution should have the ability to distinguish between the natural DC offsets, and the undesired DC offsets, and remove only the undesired term.

In addition, anther type of offset correction technique is disclosed in U.S. Pat. No. 5,422,889 to Sevenhans et al., issued Jun. 6, 1995 and titled "Offset Correction Circuit." This technique attempts to correct for DC offset by continuously updating different variable parameter offset correction values for different carrier frequencies stored in a memory. However, the Sevenhans et al. receiver is a DC coupled direct conversion receiver that can potentially suffer from saturation of baseband amplifiers due to static DC offsets. An offset correction value is calculated and applied in an attempt to keep DC offsets within some specified boundary. A more suitable approach would be desirable for AC coupled baseband receivers where DC offsets should be substantially eliminated.

Therefore, there exists a need for a cellular TDMA base station receiver that has DC offset correction suitable for use in a integrated circuit receiver. Also, it would be desirable if the base station receiver with dynamic DC offset correction also eliminated or reduced BER degradation by substantially removing only the undesired DC offset component.

BRIEF DESCRIPTION OF THE DRAWINGS

FIG. 1 is an illustration showing the effects of dynamic DC offsets in a TDMA base station receiver having a zero IF receiver;

FIGS. 4.2 and 4.3 graphically illustrate a method for determining a component of a receiver calibration correction value in accordance with one embodiment of the invention;

FIG. 7 is another embodiment of the invention utilizing a closed loop DC offset correction block as the basis for removing dynamic DC offset.

DETAILED DESCRIPTION OF THE PREFERRED EMBODIMENT

The disclosed cellular TDMA base station receiver having an AC coupled baseband receiver corrects for the dynamic DC offsets by utilizing an open loop predictive signal processing method to respond instantly to changes in AGC settings on a timeslot by timeslot basis. To effect the open loop predictive signal processing, the system takes into account not only an automatic gain control state of a timeslot of interest, but predicts DC offset as a function of all other AGC states of all timeslots in the frame. In addition, the base station receiver may also, if desired utilize separately or in combination, a closed loop error correction method that may be slower than the open loop predictive method, but can reduce the BER degradation or substantially cancel residual error left by the open loop predictive method when used in combination with the open loop predictive method. The closed loop error correction averages DC offset of a given timeslot over a series of frames to determine residual undesired DC offset and continually corrects for the detected DC offset accordingly. The disclosed TDMA base station receiver may find particular use in cellular TDMA base station zero-IF receivers, but it may be used in any suitable RF TDMA based system.

Figure 2:
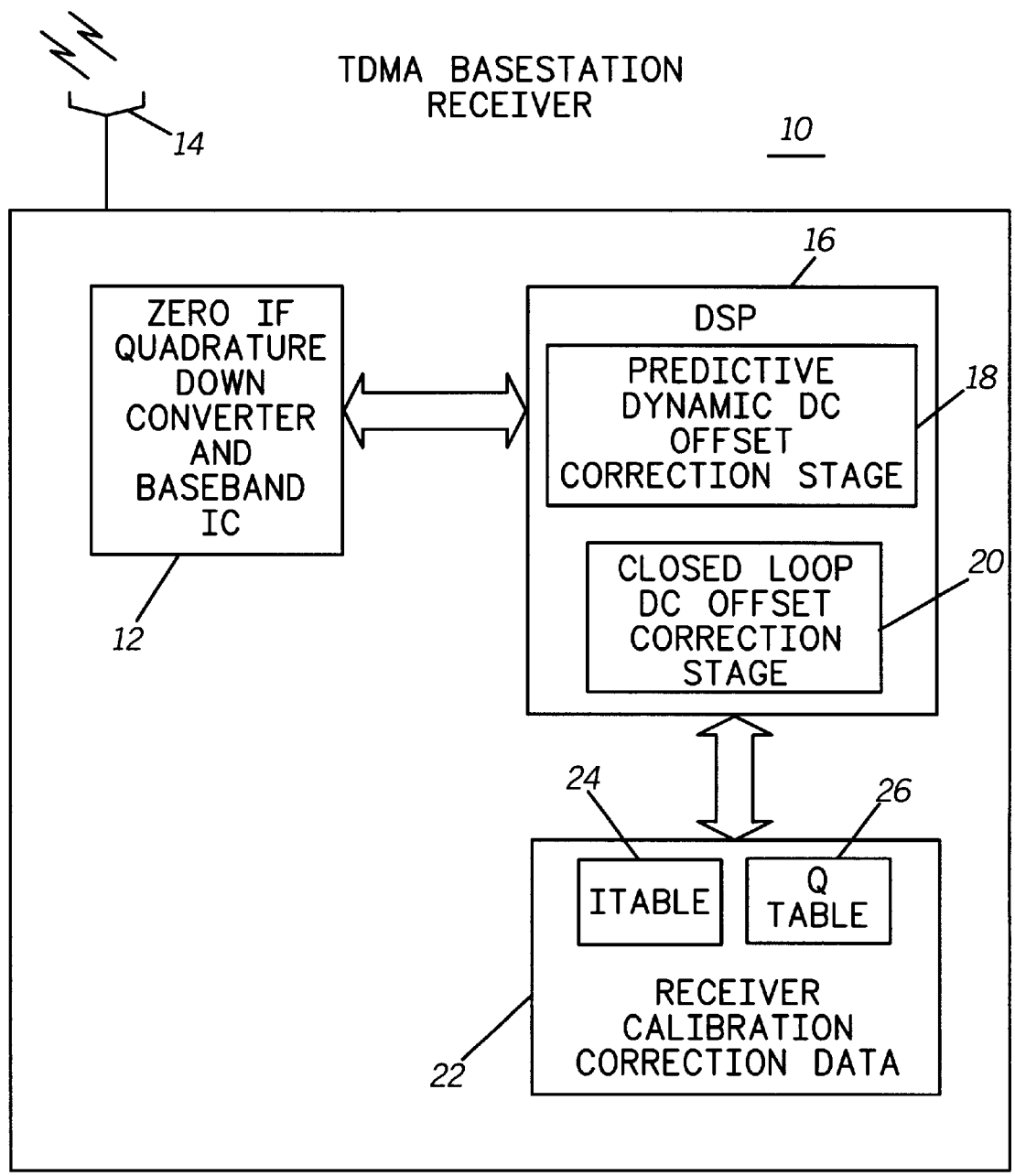
FIG. 2 is a block diagram generally depicting a cellular TDMA base station zero IF receiver with DC offset correction in accordance with one embodiment of the invention.

FIG. 2 shows a cellular TDMA base station receiver 10 with DC offset correction having a zero IF quadrature down converter and baseband integrated circuit (IC) 12 for receiving cellular TDMA frames, such as GSM formatted frames, through antenna 14. The receiver 10 is shown for one receiver branch. The receiver 10 shown would be duplicated for a diversity receiver. The cellular TMDA base station receiver 10 also includes digital signal processor IC 16, such as a Motorola Inc. DSP model number 56305, that has a predictive DC offset correction stage 18 and a closed loop DC offset correction stage 20. The cellular TDMA base station receiver 10 also includes memory 22 for storing receiver calibration offset data representing a receiver calibration offset voltage value in the form of two calibration look-up tables. One look-up table contains I channel receiver calibration offset data 24 and the other look-up table contains Q channel calibration offset data 26. Each entry in a table corresponds to a different automatic gain control (AGC) setting for a given timeslot in a frame.

Unlike conventional offset correction techniques, the predictive DC offset correction stage 18 predicts a predictive DC offset correction value for a selected timeslot using not only the stored receiver calibration data 24 and 26 corresponding to an automatic gain control (AGC) state of the selected timeslot, but also using an average of stored calibration offset data corresponding to AGC states for all timeslots in a given frame. Therefore, where a frame includes eight timeslots, the predictive DC offset correction stage determines the predictive DC offset prediction value for one timeslot as a function of AGC settings for the remaining seven timeslots. This dynamic DC offset correction prediction is done for each timeslot.

In addition to the predictive DC offset correction value, the closed loop DC offset correction stage 20 provides a closed loop DC correction value on a per timeslot basis by determining a combined DC offset value consisting of a natural DC offset level and an undesired DC offset level for the selected timeslot and by determining the undesired DC offset level by averaging the combined DC offset value for the selected timeslot over a number of frames to facilitate correction for detected DC offsets. The closed loop DC offset correction stage 20 utilizes GSM type formats where a natural DC offset of a same timeslot over a range of frames is zero even though the natural offset for one timeslot may be non-zero.

In essence, the predictive DC offset correction stage 18 serves as an open loop dynamic DC offset correction circuit and the closed loop DC offset correction stage 20 serves as a closed loop correction stage to remove residual offset components not fully eliminated by the predictive DC offset correction stage 18. As such, any non-zero result from long term averaging by the closed loop DC offset correction stage 20 is subtracted from corrected received data prior to demodulation.

In the preferred embodiment, the receiver calibration correction data 24 for the received in-phase channel data is receiver calibration offset voltage values for each automatic gain control state determined relative to a known reference value for an in-phase signal. Similarly, the receiver calibration correction data 26 for the received quadrature channel data is preferably receiver calibration offset voltage values for each automatic gain control state determined relative to a known reference value for a quadrature signal. Memory 22 may be any suitable non-volatile memory.

Figure 3:
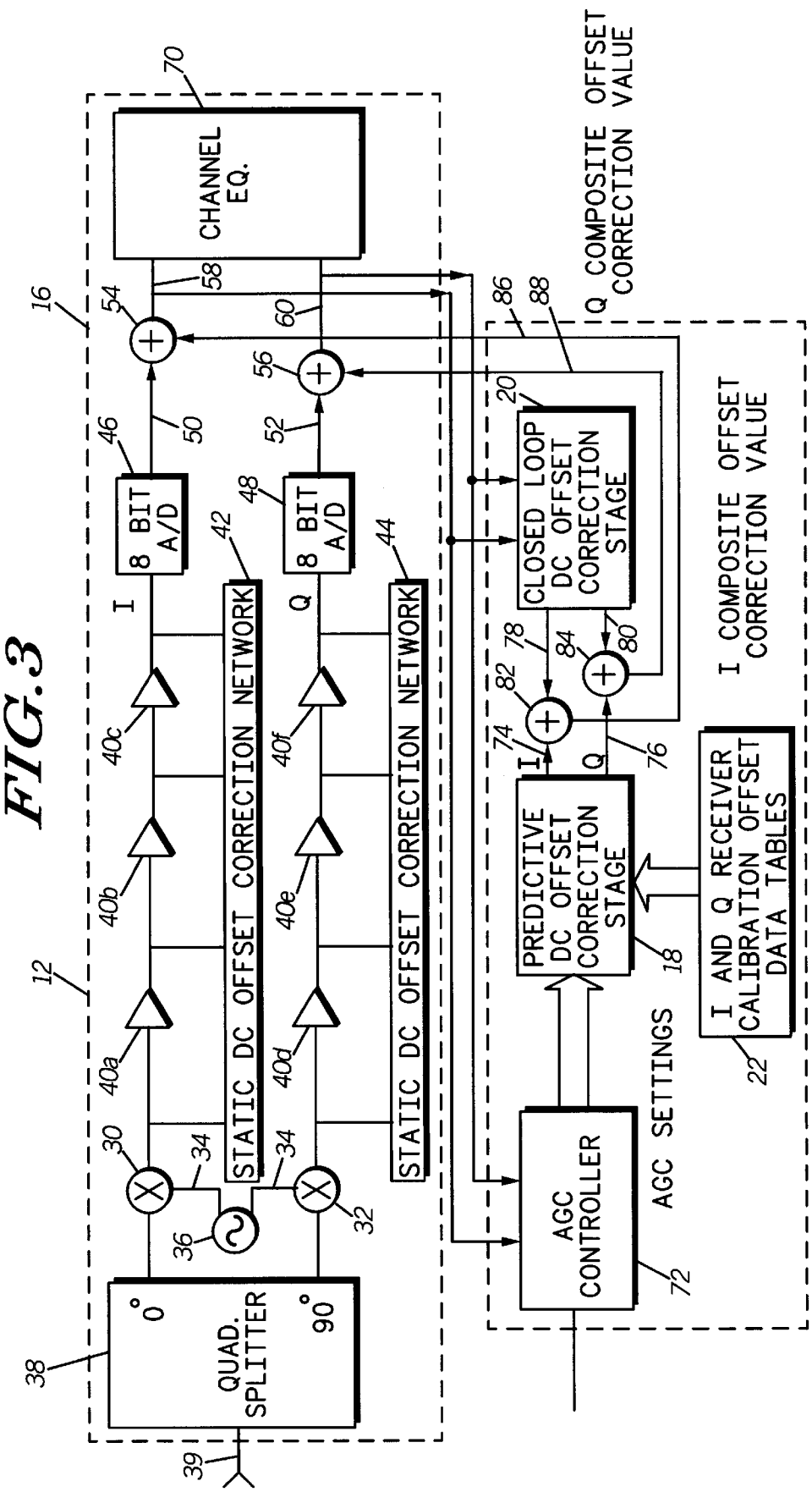
FIG. 3 is a block diagram depicting in more detail the embodiment of the cellular TDMA base station zero IF receiver with DC offset correction shown in FIG. 2.

FIG. 3 shows in more detail, the zero IF quadrature down converter and baseband IC 12 having conventional baseband in-phase channel mixing circuit 30 and a baseband quadrature phase channel mixing circuit 32 each coupled to receive and mix a local oscillator (LO) frequency signal 34 output by local oscillator circuit 36. Hence, the baseband in-phase channel mixing circuit, the baseband quadrature phase mixing circuit and the local oscillator are all located on the same integrated circuit. In a preferred embodiment the IF frequency is 167 MHz and the local oscillator frequency 34 is also 167 MHz thereby creating a zero IF receiver with a relatively high IF frequency. However, it will be recognized by those having ordinary skill in the art that the LO generator can be any suitable frequency. The zero IF quadrature down converter and baseband IC 12 is preferably a dual conversion type receiver to minimize complexity and cost. However, it will be recognized that a triple conversion receiver or other configuration may also be used if desired.

The mixing circuits 30 and 32 also receive the phase adjusted RF signals from quadrature splitter 38 as known in the art. An AGC controlled variable gain amplifier 39 provides the quadrature splitter 38 with an amplified received signal also as known in the art. As previously discussed, LO leakage can enter an input of the amplifier 39 causing dynamic DC variations between timeslots depending on the gain of the amplifier 39 for a given timeslot.

As with conventional quadrature down converter receiver sections, the zero IF quadrature down converter and baseband IC 12 also includes a series of gain stages 40A through 40F. Between the gain stages 40A–40F are a series of static DC offset correction networks indicated as 42 and 44. The static offsets are addressed by the offset correction networks 42 and 44 as known in the art. By virtue of the offset correction networks 42 and 44, the zero IF quadrature down converter and baseband IC 12 is an AC coupled receiver. The I channel data output from the gain stages 40A through 40C serves as input data to an 8 bit analog to digital (A/D) converter 46 as known in the art. Similarly, the I channel data output from the gain stages 40D through 40F, having been passed through the static DC offset collection network 44, serves as Q channel data input to another 8 bit A/D 48 as also known in the art.

Uncorrected baseband I and Q channel digitized signals 50 and 52 output from the A/D converters 46 and 48 is corrected for dynamic DC offset voltages through summing network 54 and 56 respectively. Resulting DC offset corrected baseband digitized signals 58 and 60 serve as input signal data to a channel equalizer 70 where conventional signal processing is performed to determine the information received through the quadrature down converter and baseband IC 12. The channel equalizer 70 is a conventional equalizer and includes a matched filter and MLSE Viterbi algorithm.

In a conventional manner, AGC controller 72 samples the DC offset corrected baseband digitized signal 58 for the I channel and the DC offset corrected baseband digitized signal 60 for the Q channel to determine the proper automatic gain control for the variable gain amplifier 39 on a per timeslot basis. The AGC control value is based on the power level at the channel equalizer 70 input (I2+Q2)1/2, and is performed independently for each timeslot. The AGC controller 72 attempts to maintain the mean value of the received signal at one half of the A/D converter full scale. The AGC controller 72 will integrate the short term Rayleigh variation, as it follows the long term log-normal variation. As shown, the I and Q inputs, of DC offset corrected baseband digitized signals 58 and 60 to the AGC algorithm are taken after the I and Q composite correction values 86 and 88 are applied.

In addition to determining the AGC setting for all timeslots for a given frame (such as for 8 timeslots for an 8 timeslot frame), the AGC controller settings are retrieved by the predictive DC offset correction stage 18. The predictive DC offset correction stage 18 also receives the I channel and Q channel DC offset calibration values 24 and 26 from the lookup tables to determine predictive offset correction values 74 for each timeslot of the I channel and predictive offset correction values 76 for each timeslot of the Q channel.

The closed loop DC offset correction stage 20 receives the corrected baseband I and Q channel digitized signals 58 and 60 and analyzes the corrected baseband I and Q channel digitized signals 58 and 60 for the combined natural and undesired dynamic DC components. As previously noted, the natural DC offset refers to the inherent, non-zero, DC value of the burst or timeslot. The GSM system, as a GMSK based system, has these characteristics. It has been found that with random modulation, there is greater than 40% probability that the natural DC offset (of I or Q) will exceed 1.5% of full scale. To remove the natural offset would have the same degradation affects as adding an erroneous offset of equal amplitude. Therefore, a viable DC offset solution should have the ability to distinguish between the natural DC offsets, and the undesired DC offsets, and remove only the undesired term.

The closed loop DC offset correction stage 20 generates an I channel closed loop DC correction value 78 and also generates a Q channel closed loop DC correction value 80 on a per timeslot basis. The combination of these I and Q closed loop DC correction values 78 and 80 may be considered to be a closed loop DC correction vector. An I channel DC correction value summing stage 82 sums the predictive DC offset correction value 74 with closed loop DC correction value 78 on a per timeslot basis to generate an I channel composite offset correction value 86. The closed loop DC correction value 78 is determined by averaging the same timeslot over a series of eight or ten frames. Similarly, DC offset correction value summer 84 sums the Q channel predictive offset correction value 76 with the closed loop DC correction value 80 to generate a Q channel composite offset correction value 88.

The Q channel summer 56 receives the composite offset correction value 88 and subtracts the composite offset correction value 88 from the uncorrected Q channel baseband digitized signal 52 to generate the Q channel DC offset corrected baseband digitized signal 60. Similarly, summer 54 receives the I channel composite offset correction value 86 and subtracts this value from the uncorrected baseband I channel digitized signal 50 to generate the DC offset corrected baseband digitized signal 58 for use by the channel equalizer 70. In the receiver 10, preferably, all signal processing tasks are performed by the same digital signal processor 16 which performs channel equalization. However, a separate processor may be used if desired.

Figure 4:
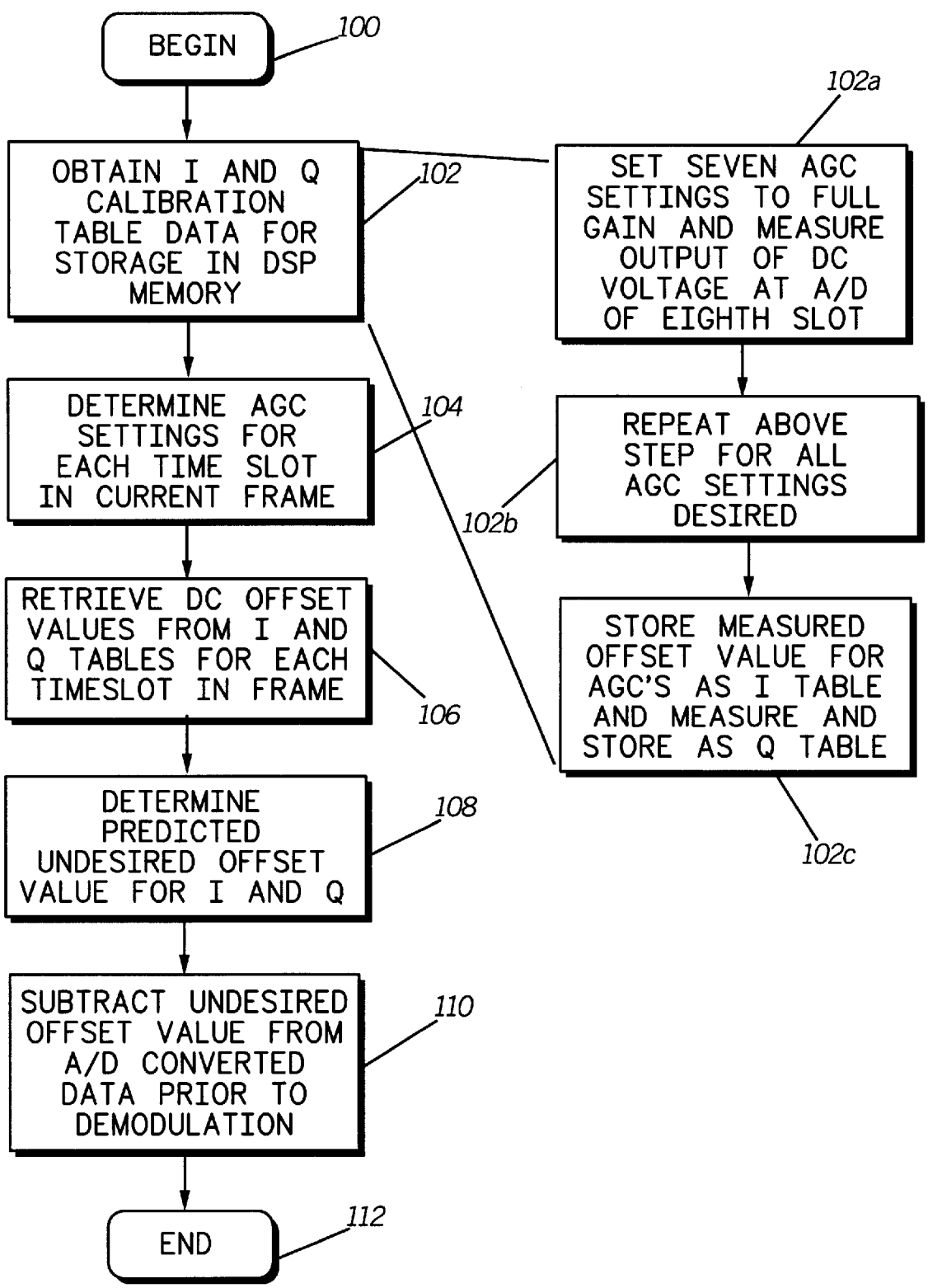
FIG. 4.1 is a flow diagram generally depicting the operation of the predictive DC offset correction stage of the cellular TDMA base station receiver shown in FIG. 2.

As shown in FIG. 4.1, the receiver 10 is powered up during the manufacturing process as shown in block 100. The DSP 16 operates to determine and store the receiver calibration correction data 24 and 26 in the tables. This calibration data is taken at room temperature. Consequently, the predictive DC offset correction stage may be susceptible to some error resulting from temperature drift. The closed loop DC offset correction stage compensates for this residual error. The receiver 10 may also be modified to evaluate temperature increases from a thermal monitoring device in the base station. In this way, the receiver 10 can automatically provide additional dynamic DC offset correction.

The DSP 16 generates the predictive DC offset correction values 74 and 76 by first obtaining I channel and Q channel calibration table data stored in memory 22. This is shown in block 102. In the case of an 8 timeslot frame, the DSP 16 obtains receiver calibration offset data 24 and 26, representing a receiver calibration offset voltage value for each automatic gain control state for I channel and Q channel determined to a relative known reference value, by setting 7 AGC settings to full gain and measuring an output of the DC voltage at the A /D 46 and 48 of the 8th slot. This is shown in block 102A.

Referring to FIG. 4.2 and FIG. 4.3, during the calibration process, the DSP measures and stores the voltage difference between each AGC setting, and the reference setting. For convenience, the reference setting is preferably full gain. The DSP configures seven of the eight timeslots at the reference setting (full gain). The DSP then configures the 8th timeslot at the AGC setting to be calibrated (n). A DC offset waveform will be produced in both I and Q channel. The DC voltage value of the 8th timeslot is measured by the channel equalizer 70 by averaging several samples per timeslot over multiple successive frames. The peak voltage value measured from a 0 V reference (or other suitable reference voltage) serves as the base for determining the calibration offset data. Based on the ⅞ths duty cycle, the DC value V(n) of the eighth timeslot is ⅞ths of the DC offset waveform. Therefore, it is ⅞ths of the DC value of the eighth timeslot voltage which is stored in the calibration table for this AGC setting. As shown, Vni and Vnq denote the offset voltage values which are stored for the nth AGC state, for I and Q respectively. The Vni and Vnq can have either a positive, or negative value. This calibration process is repeated for each of the AGC settings as shown in block 102b.

As indicated in block 102c, the receiver calibration offset voltage values are stored after being measured for each AGC setting as a separate I channel table and as a separate Q channel table in memory 22. The receiver calibration offset data stored in non-volatile memory 22 as tables, is accessed every timeslot by the DSP 16 and used to calculate the appropriate dynamic predictive DC offset correction value 74 and 76. The table consists of offset values, corresponding to each possible AGC state. An example of the data in the tables is shown below in columns (a), (b) and (c) where columns (a) and (b) form the I table and columns (a) and (c) form the Q table.

| Timeslot | (a)<br>AGC State | (b)<br>Ioffset (from cal) | (c)<br>Qoffset (from cal) |
|---|---|---|---|
| 0 | $n_0$ | $V_{n0I}$ | $V_{n0Q}$ |
| 1 | $n_1$ | $V_{n1I}$ | $V_{n1Q}$ |
| 2 | $n_2$ | $V_{n2I}$ | $V_{n2Q}$ |
| 3 | $n_3$ | $V_{n3I}$ | $V_{n3Q}$ |
| 4 | $n_4$ | $V_{n4I}$ | $V_{n4Q}$ |
| 5 | $n_5$ | $V_{n5I}$ | $V_{n5Q}$ |
| 6 | $n_6$ | $V_{n6I}$ | $V_{n6Q}$ |
| 7 | $n_7$ | $V_{n7I}$ | $V_{n7Q}$ |

It is preferred that the receiver calibration offset voltage values (columns (b) and (c)) stored in the I table and Q tables be interpolated for the first 30 dB range of AGC settings. Thereafter the remaining receiver calibration offset voltage values may be extrapolated from selected measurements to save time during the manufacturing process. For each frame, (N), each of the eight timeslots have corresponding AGC settings, and calibration parameters, as above.

During operation of the cellular TDMA base station receiver, the AGC controller 72 determines the AGC settings for each timeslot in a current frame as shown in block 104. Under control of the DSP, the predictive DC offset correction stage 18 retrieves the DC offset values corresponding to that AGC setting from the I and Q tables as shown in block 106. The predictive DC offset correction stage 18 then separately determines the predicted DC offset correction values 74 and 76 (undesired offset values for I and Q channel). The DC offsets are produced from a linear process, and therefore, superposition can be applied to describe and predict the composite DC output waveform. Moreover, since the DC offset correction networks 42 and 44 AC couple the gain stages, it is only the apparent DC voltage for any one timeslot that can be non-zero.

The predictive DC offset correction stage 18 determines the predictive DC offset correction values 74 and 76 (Ipredict and Qpredict) according to the following equations:

$$Ipredict(ts) = Ioffset(ts) - \frac{\sum_{x=0}^{7} Ioffset(x)}{8}$$

and $$Qpredict(ts) = Qoffset(ts) - \frac{\sum_{x=0}^{7} Qoffset(x)}{8}$$

Where:
Ipredict(ts) is the predicted DC offset in the I channel for the (ts) timeslot.
Qpredict(ts) is the predicted DC offset in the Q channel for the (ts) timeslot.
Ioffset(ts) is the stored receiver calibration offset data (offset voltage value) for the I channel corresponding to the (ts) timeslot.
Qoffset(ts) is the stored receiver calibration offset data (offset voltage value) for the Q channel corresponding to the (ts) timeslot.
Ioffset(x) is the stored receiver calibration offset data for the I channel corresponding to each of the 8 timeslots (x between zero and 7).
Qoffset(x) is the stored receiver calibration offset data for the Q channel corresponding to each of the 8 timeslots (x between zero and 7).

Once the predicted DC offsets values are determined for each timeslot, these predicted values are subtracted from the uncorrected I channel signal data and the uncorrected baseband Q channel digitized signals 50 and 52 (see FIG. 6) by the DSP 16, as shown in block 110. The process continues as needed as shown by block 112.

Figure 5:
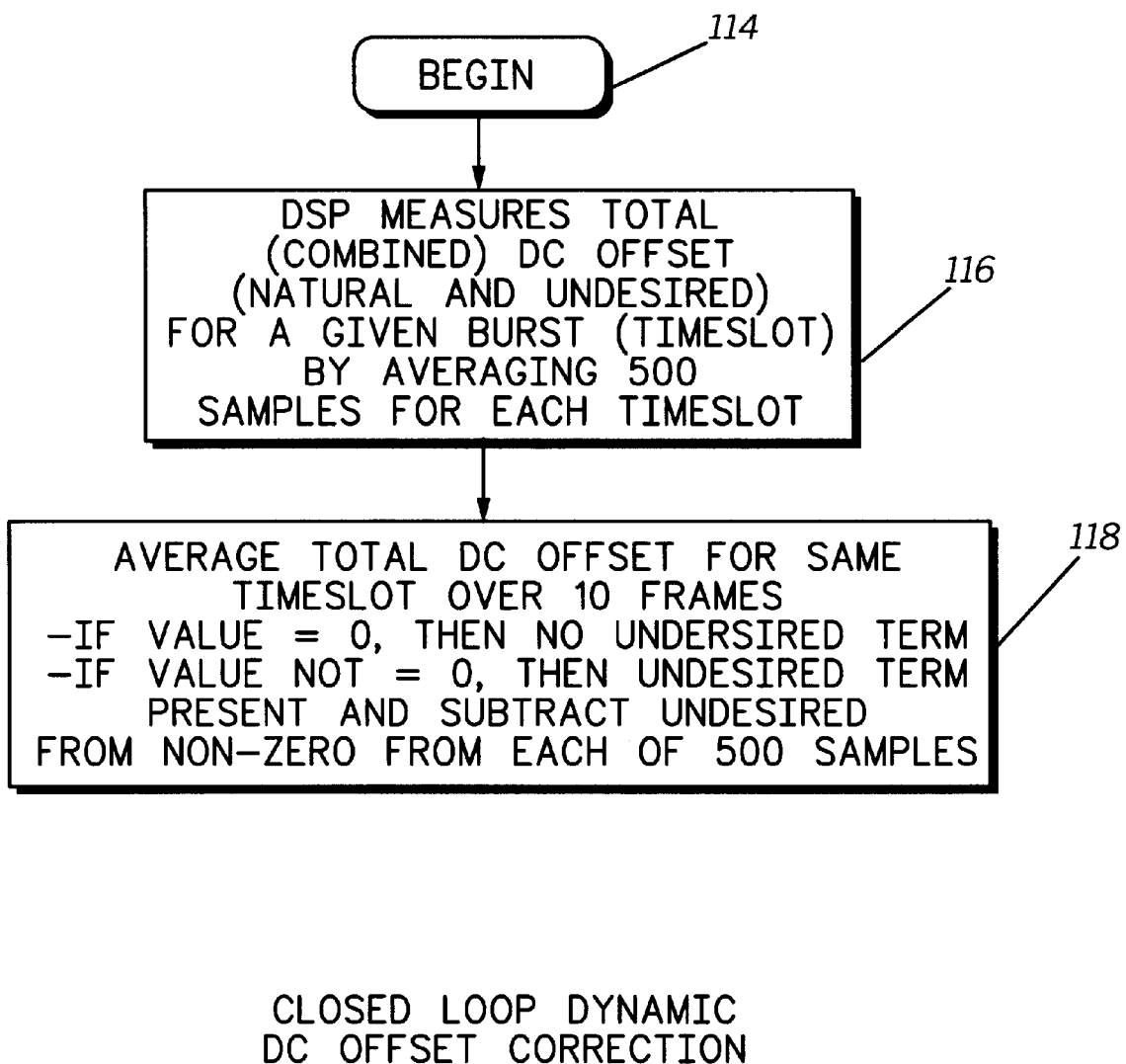
FIG. 5 is a general flow diagram depicting the steps carried out by a digital signal processor in the cellular TDMA base station zero IF receiver with DC offset correction to perform closed loop DC offset correction in accordance with the invention.

FIG. 5 shows the steps used by the closed loop DC offset correction stage 20 which examines the long term DC value of each timeslot, over the course of multiple TDMA frames. The long term average should approach zero. Therefore, any deviation from zero is used to augment the correction values determined by the predictive DC offset correction stage 18. To accomplish this, the closed loop DC offset correction stage 20 samples the corrected baseband I and Q channel digitized signals 58 and 60 as shown in block 114. The DC offset correction stage 20, under control of the DSP 16, measures a combined DC offset value consisting of both the natural DC offset level and undesired DC offset level over a given timeslot by taking 500 samples of the signal for each timeslot.

It has been determined that offsets in I and Q channels are independent. Offsets in consecutive TDMA frames (for a given timeslot) are not independent; this results from the significant deterministic content of the GSM burst (midamble, tail bits, etc.). The magnitude of the DC offsets follow a Gaussian distribution, and are essentially bounded by +12% of full scale. Where corrected baseband I and Q channel digitized signal 58 and 60 are independently averaged over eight consecutive bursts, there is 90% confidence that the average value of I+Q is less than 1.5% of full scale. This figure is generally considered acceptably close to zero. Therefore, averaging over 8–10 TDMA frames is recommended. This will permit convergence in 8 TDMA frames (one speech frame) and will help insure (with 90% confidence) less than 1.5% residual DC offset.

As shown in block 118, the closed loop DC offset correction stage 20 determines the combined DC offset value by determining the undesired DC offset level by averaging the combined DC offset value for the selected timeslot over a plurality of frames. If the average combined DC offset value for the same timeslot is zero, then there is only natural DC offset and no undesired term exists. If the combined DC offset value is not zero, then an undesired DC offset exists and this amount is added to the predictive DC offset value 74 or 76 respectively. In this way, the summers 80 and 82 provide a composite offset correction value 86 and 88 by summing the predictive DC correction value 74 and the closed loop DC correction value 76 on a timeslot by timeslot basis to obtain a composite DC offset correction value 86 and 88. Where no predictive DC offset correction stage 18 is used, the DSP 16 subtracts the undesired amount from each of the 500 samples.

In summary, DC offsets for a given timeslot are predicted by the disclosed receiver. The prediction is based on calibration data pertaining to the timeslot in question, and also the conditions pertaining to each of the other seven timeslots in the TDMA frame. The receiver also utilizes information about the inherent or natural DC value of a TDMA timeslot, or GSM burst, by taking into account the finding that a timeslot may have a non-zero DC offset but the long term average of consecutive bursts is zero.

Figure 6:
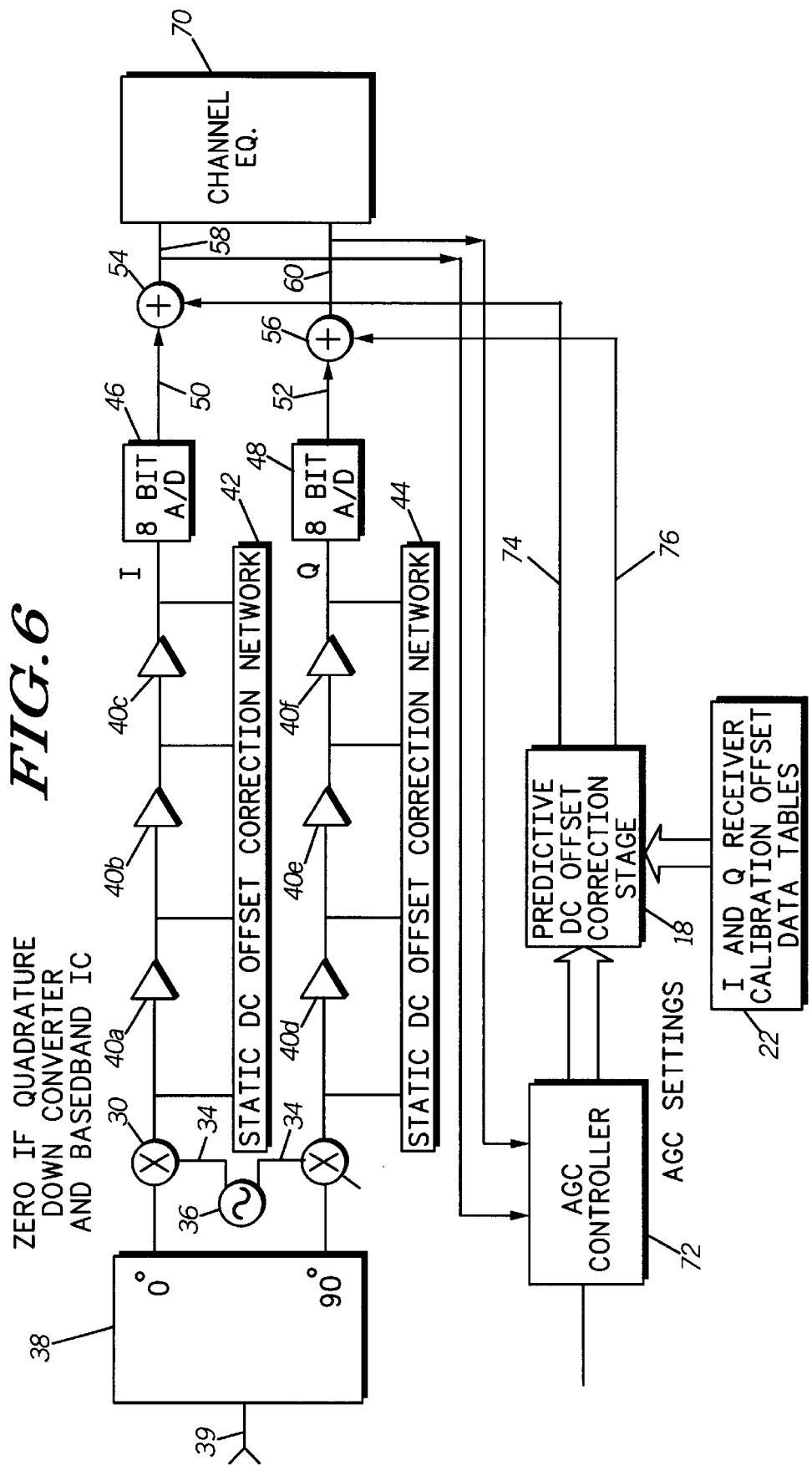
FIG. 6 is a block diagram generally depicting another embodiment of the invention using only predictive DC offset correction as the basis for correcting for dynamic DC offset.

FIG. 6 shows a receiver using only the predictive DC offset correction block 18 without the closed loop DC offset correction stage 20. In this embodiment, the predicted DC offset values are subtracted from the uncorrected baseband I channel digitized signal 50 and the uncorrected baseband Q channel digitized signal 52 (see FIG. 6) by the DSP 16. In the embodiment shown in FIG. 3, the correction values determined by the closed loop correction stage 20 are also subtracted from the uncorrected baseband I channel digitized signal 50 and the uncorrected baseband Q channel digitized signal 52.

FIG. 7 is another embodiment of a receiver using only the closed loop DC offset correction stage 20 for correcting for the dynamic DC offset. In this embodiment, the closed loop DC offset values are subtracted from the uncorrected baseband I channel digitized signal 50 and the uncorrected baseband Q channel digitized signal 52 by the DSP 16.

While the invention has been particularly shown and described with reference to a particular embodiment, it will be understood by those skilled in the art that various changes in form and details may be made therein without departing from the spirit and scope of the invention. The corresponding structures, materials, acts and equivalents of all means or step plus function elements in the claims below are intended to include any structure, material, or acts for performing the functions in combination with other claimed elements as specifically claimed.

What we claim is:

1. A cellular TDMA base station receiver having an AC coupled baseband receiver with DC offset correction comprising:

storage means for storing receiver calibration offset data representing a receiver calibration offset voltage value for each automatic gain control (AGC) state determined relative to a known reference value wherein the storage means contains a table of in-phase (I) channel receiver calibration offset data representing receiver calibration offset voltage values for each automatic gain control (AGC) state determined relative to a known reference value for an in-phase signal, and also contains a table of quadrature phase (Q) channel receiver calibration offset data representing receiver calibration offset voltage values for each automatic gain control (AGC) state determined relative to a known reference value for a quadrature signal; and means for predicting a predictive DC offset correction value for a selected timeslot using stored receiver calibration offset data corresponding to an AGC state of the selected timeslot and an average of stored calibration offset data corresponding to AGC states for all timeslots in a given frame.

2. The base station receiver of claim 1 further comprising means for providing a closed loop DC correction value on a per timeslot basis by determining a combined DC offset value consisting of a natural DC offset level and an undesired DC offset level for the selected timeslot and by determining the undesired DC offset level by averaging the combined DC offset value for the selected timeslot over a plurality of frames; and means for providing a composite DC offset correction value by summing the predictive DC correction value and the closed loop DC correction value on a timeslot by timeslot basis to facilitate correction for detected DC offsets.

3. The base station receiver of claim 2 wherein the means for predicting and the means for providing a closed loop DC correction value is a digital signal processor.

4. The base station receiver of claim 1 having a baseband in-phase channel mixing circuit and a baseband quadrature phase channel mixing circuit coupled to mix a local oscillator (LO) frequency from a local oscillator circuit wherein the baseband in-phase channel mixing circuit, the baseband quadrature phase channel mixing circuit and the local oscillator are located on a same integrated circuit chip.

5. The base station receiver of claim 3 wherein the receiver is a zero intermediate frequency (IF) receiver having an IF frequency of at least 167 MHz and local oscillator (LO) frequency of at least 167 MHz.

6. The base station receiver of claim 5 wherein the means for predicting accesses the table every timeslot to determine an appropriate predictive DC offset correction value based on an accessed receiver calibration offset voltage value.

7. The base station receiver of claim 1 further including means for setting AGC settings and for measuring an output of an A/D converter to determine the receiver calibration offset data representing the receiver calibration offset voltage values for each automatic gain control (AGC) state determined relative to the known reference value for storage in the storage means.

8. The base station receiver of claim 5 wherein the means for predicting the DC offset correction value is a digital signal processor that:

determines an AGC setting for each timeslot in a current frame;

retrieves the I channel receiver calibration offset data and Q channel receiver calibration offset data from the tables for each timeslot in the frame; and subtracts the predictive DC offset correction value, which represents an undesired DC offset component, from digital I and Q baseband data prior to demodulation.

9. A cellular TDMA base station receiver having an AC coupled baseband receiver with DC offset correction comprising:

storage means for storing receiver calibration offset data representing a receiver calibration offset voltage value for each automatic gain control (AGC) state determined relative to a known reference value wherein the storage means contains a table of in-phase (I) channel receiver calibration offset data representing receiver calibration offset voltage values for each automatic gain control (AGC) state determined relative to a known reference value for an in-phase signal, and also contains a table of quadrature phase (Q) channel receiver calibration offset data representing receiver calibration offset voltage values for each automatic gain control (AGC) state determined relative to a known reference value for a quadrature signal;

means for predicting a predictive DC offset correction value for a selected timeslot using stored receiver calibration offset data corresponding to an AGC state of the selected timeslot and an average of stored calibration offset data corresponding to AGC states for all timeslots in a given frame, wherein the means for predicting the predictive DC offset correction value is a digital signal processor that:

determines an AGC setting for each timeslot in a current frame;

retrieves I channel receiver calibration offset data and Q channel receiver calibration offset data from the storage means for each timeslot in the frame; and subtracts the predictive DC offset correction value, which represents an undesired DC offset component, from digital I and Q baseband data prior to demodulation;

means, responsive to corrected baseband information, for providing a closed loop DC correction value on a per timeslot basis by determining a combined DC offset value consisting of a natural DC offset level and an undesired DC offset level for the selected timeslot and by determining the undesired DC offset level by averaging the combined DC offset value for the selected timeslot over a plurality of frames; and means for providing a composite offset correction value by summing the predictive DC correction value and the closed loop DC correction value on a timeslot by timeslot basis to facilitate correction for detected DC offsets.

10. The base station receiver of claim 9 having a baseband in-phase channel mixing circuit and a baseband quadrature phase channel mixing circuit coupled to mix a local oscillator (LO) frequency from a local oscillator circuit wherein the baseband in-phase channel mixing circuit, the baseband quadrature phase channel mixing circuit and the local oscillator are located on a same integrated circuit chip.

* * * * *